(12) United States Patent
Yang et al.

(10) Patent No.: US 10,079,611 B1
(45) Date of Patent: Sep. 18, 2018

(54) COMPARATOR AND SUCCESSIVE APPROXIMATION ANALOG-TO-DIGITAL CONVERTER THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Hai Feng Yang, Shanghai (CN); Hua Tang, Shanghai (CN); Fei Liu, Shanghai (CN); Ben Peng Xun, Shanghai (CN); Xiao Ming Zhu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/916,517

(22) Filed: Mar. 9, 2018

(30) Foreign Application Priority Data

Mar. 9, 2017 (CN) .......................... 2017 1 0137622

(51) Int. Cl.
| | |
|---|---|
| *H03M 1/12* | (2006.01) |
| *H03M 1/46* | (2006.01) |
| *H03M 1/06* | (2006.01) |
| *H03M 1/38* | (2006.01) |

(52) U.S. Cl.
CPC ........... *H03M 1/466* (2013.01); *H03M 1/069* (2013.01); *H03M 1/38* (2013.01); *H03M 1/462* (2013.01); *H03M 1/468* (2013.01)

(58) Field of Classification Search
CPC ........ H03M 1/38; H03M 1/462; H03M 1/466; H03M 1/468; H03M 1/069
USPC ......... 341/155, 163, 172; 327/55, 63, 65, 67
See application file for complete search history.

(56) References Cited

U.S. PATENT DOCUMENTS

| | | | |
|---|---|---|---|
| 8,344,931 B2 * | 1/2013 | Zhu ....................... | H03M 1/002 341/155 |
| 8,760,338 B2 * | 6/2014 | Danjo .................... | H03K 5/249 341/155 |
| 9,490,832 B1 * | 11/2016 | Zhou ................... | H03M 1/0872 |

* cited by examiner

*Primary Examiner* — Khai M Nguyen
(74) *Attorney, Agent, or Firm* — Anova Law Group, PLLC (57) ABSTRACT

A comparator and a successive approximation analog-to-digital converter are provided. The comparator includes a pre-operational amplifier, a latch, a level shift unit, and a reset unit. The pre-operational amplifier receives a to-be-compared signal, and outputs a first-stage amplification signal and a latch clock signal. The latch includes a first inverter circuit and a second inverter circuit, receives and compares the first-stage amplification signal, and outputs a comparison result signal. The level shift unit includes a first level shift circuit and a second level shift circuit, and generates a potential difference between working transistors in the first inverter circuit and the second inverter circuit, respectively. The reset unit includes a first reset circuit and a second reset circuit, and resets a voltage of a node where the level shift unit, the first inverter circuit and the second inverter circuit are coupled when the latch clock signal is at a low level.

20 Claims, 4 Drawing Sheets

COMPARATOR AND SUCCESSIVE APPROXIMATION ANALOG-TO-DIGITAL CONVERTER THEREOF

CROSS-REFERENCES TO RELATED APPLICATIONS

This application claims the priority of Chinese patent application No. 201710137622.2, filed on Mar. 9, 2017, the entirety of which is incorporated herein by reference.

FIELD OF THE DISCLOSURE

The present disclosure generally relates to the field of electronic circuit technology and, more particularly, relates to a comparator and successive approximation analog-to-digital converter thereof.

BACKGROUND

An analog-to-digital converter (ADC) is one of core components of current applied electronic apparatus and communication apparatus. Due to the electronic market demand for portable electronic communication apparatus in recent years, low-power consumption and high-precision ADC has become the main development trend of ADC technology. As one of the main components of the ADC structure, a comparator, especially a high-speed and low-power consumption comparator, is very popular on the market.

Figure 1:
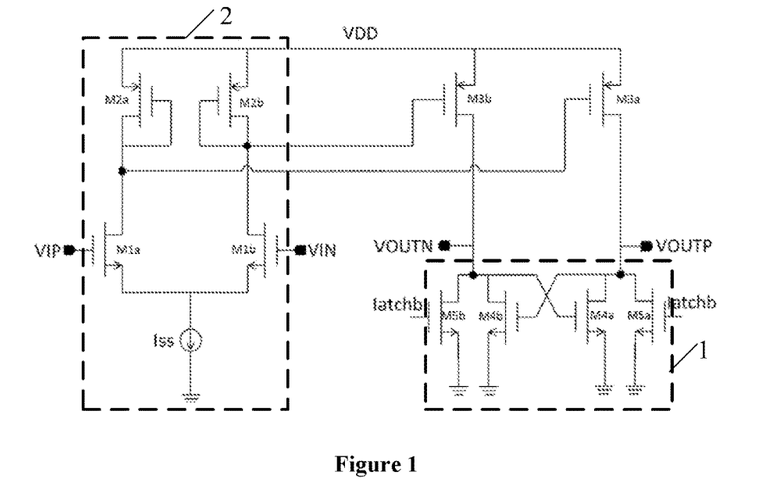
FIG. 1 illustrates a schematic diagram of a comparator.
Figure 2:
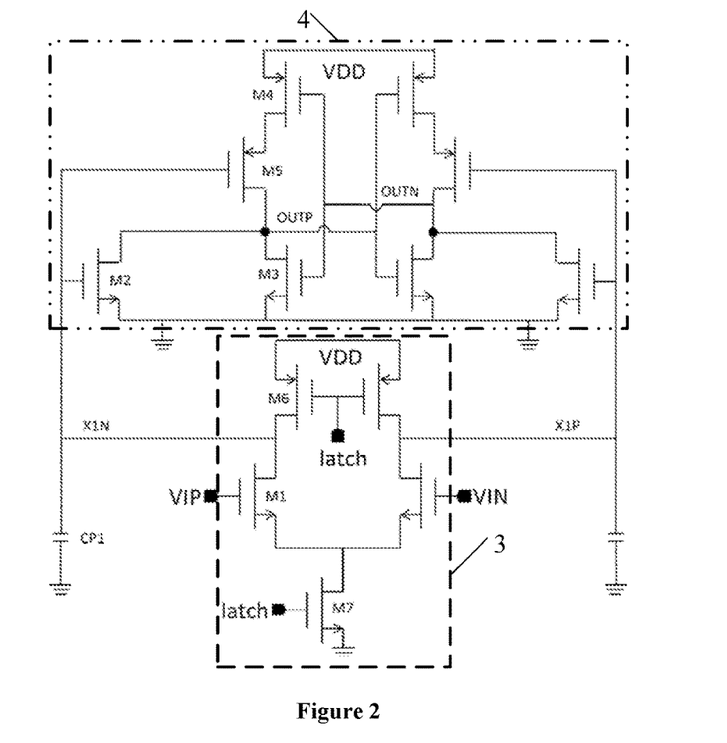
FIG. 2 illustrates a schematic diagram of another comparator.

FIGS. 1-2 illustrate schematic diagrams of representative comparators. The comparator illustrated in FIG. 1 is a comparator based on a structure of a latch 1 having a pre-static amplifier 2. The pre-static amplifier 2 enables the comparator to provide a small-signal gain. The comparator can withstand Kickback noise coupled to the input terminal due to a large jump in the output terminal of the latch 1, and have a fast speed. However, the comparator has an issue of large-static-power consumption.

FIG. 2 illustrates a comparator having a dynamic preamp amplifier 3 and a latch 4. The comparator is used to solve the large-power consumption issue. The input signal is amplified by using synchronous discharge time of node capacitors, to realize pre-amplification. The comparator illustrated in FIG. 2 not only overcomes the large-power consumption issue in the comparator illustrated in FIG. 1, and but also has a small Kickback noise.

However, conventional comparators have the issues of low speed and low gain. The disclosed device structures and methods are directed to solve one or more problems set forth above and other problems.

BRIEF SUMMARY OF THE DISCLOSURE

One aspect of the present disclosure includes a comparator. The comparator includes a pre-operational amplifier for receiving a to-be-compared signal inputted to the comparator, and outputting a first-stage amplification signal according to the to-be-compared signal and a latch clock signal. The comparator also includes a latch including a first inverter circuit and a second inverter circuit that have a same structure and are symmetrically configured, and for receiving and comparing the first-stage amplification signal, and outputting a corresponding comparison result signal according to a comparison result. In addition, the comparator includes a level shift unit including a first level shift circuit and a second level shift circuit that are symmetrically configured, and for generating a potential difference between working transistors in the first inverter circuit and the second inverter circuit, respectively. Further, the comparator includes a reset unit including a first reset circuit and a second reset circuit that are symmetrically configured, and for resetting a voltage of a node where the level shift unit, the first inverter circuit and the second inverter circuit are coupled when the latch clock signal is at a low level.

Another aspect of the present disclosure includes a successive approximation analog-to-digital converter. The successive approximation analog-to-digital converter includes a comparator and a digital/analog conversion circuit coupled to an input terminal of the comparator. The comparator includes a pre-operational amplifier for receiving a to-be-compared signal inputted to the comparator, and outputting a first-stage amplification signal according to the to-be-compared signal and a latch clock signal. The comparator also includes a latch including a first inverter circuit and a second inverter circuit that have a same structure and are symmetrically configured, and for receiving and comparing the first-stage amplification signal, and outputting a corresponding comparison result signal according to a comparison result. In addition, the comparator includes a level shift unit including a first level shift circuit and a second level shift circuit that are symmetrically configured, and for generating a potential difference between working transistors in the first inverter circuit and the second inverter circuit, respectively. Further, the comparator includes a reset unit including a first reset circuit and a second reset circuit that are symmetrically configured, and for resetting a voltage of a node where the level shift unit, the first inverter circuit and the second inverter circuit are coupled when the latch clock signal is at a low level.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

For a high-speed and low-power consumption successive approximation analog-to-digital converter (SAR ADC), multiple comparisons have to be accomplished within a single clock cycle, therefore the comparator has very short time to accomplish comparison. At the same time, the high-precision SAR ADC has to distinguish a small input voltage, which also affects the comparison time of the comparator. Therefore, the SAR ADC desires a high-speed and high-gain comparator. In addition, because the structure of the SAR ADC can achieve a low-power consumption design, a circuit of the comparator also uses a low-power consumption design. These requirements of the SAR ADC desire a dynamic-structure, high-speed and high-gain comparator. However, the current comparator has the issues of low-speed and low-gain.

Figure 3:
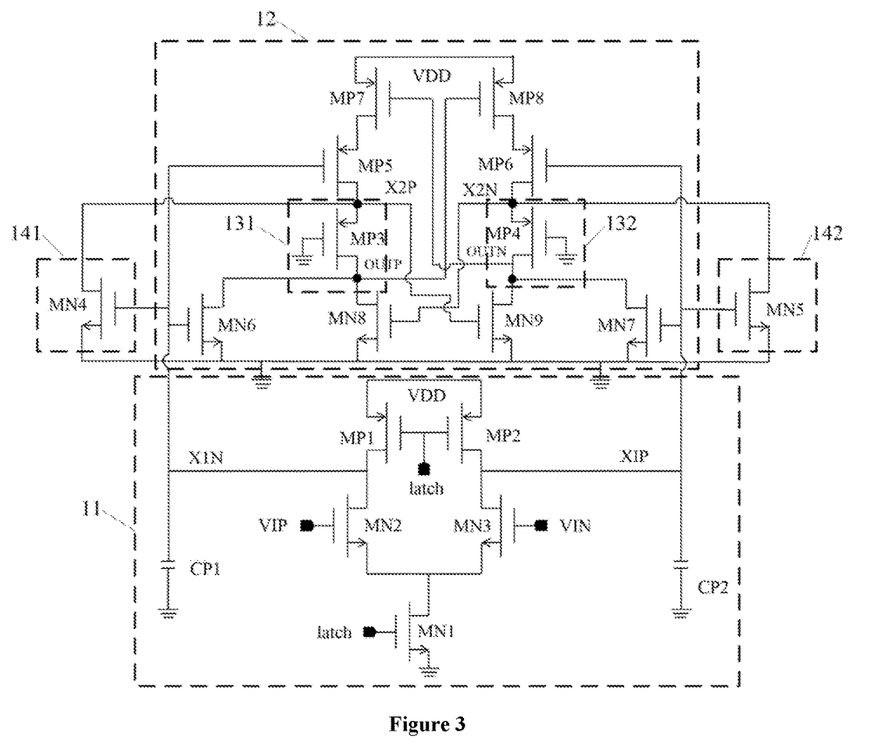
FIG. 3 illustrates a schematic diagram of an exemplary comparator consistent with various disclosed embodiments of the present disclosure.

The present disclosure provides a comparator. FIG. 3 illustrates a schematic diagram of a comparator consistent with various disclosed embodiments of the present disclosure. Referring to FIG. 3, the comparator may include a pre-operational amplifier 11, a latch 12, a level shift unit, and a reset unit.

The pre-operational amplifier 11 may be adapted to receive a to-be-compared signal inputted to the comparator, and output a first-stage amplification signal according to the to-be-compared signal and a latch clock signal.

The latch 12 may include a first inverter circuit and a second inverter circuit that are symmetrical in structure, and may be adapted to receive the first-stage amplification signal, compare the first-stage amplification signal, and output a corresponding comparison result signal according to the comparison result. The first inverter circuit and the second inverter circuit may have a same structure, and may be symmetrically connected in parallel between a reference power supply and a reference ground. A signal input terminal of the first inverter circuit may be connected to a signal output terminal of the second inverter circuit, and a signal output terminal of the first inverter circuit may be connected to a signal input terminal of the second inverter circuit.

The level shift unit may include a first level shift circuit 131 and a second level shift circuit 132 that are symmetrically configured. The first level shift circuit 131 may be coupled to the reset unit and the first inverter circuit, and may be adapted to turn on the first inverter circuit when the comparator jumps from a reset state to a comparison state. The second level shift circuit 132 may be coupled to the reset unit and the second inverter circuit, and may be adapted to turn on the second inverter circuit when the comparator jumps from the reset state to the comparison state.

The reset unit may include a first reset circuit 141 and a second reset circuit 142 that are symmetrically configured. The first reset circuit 141 may be coupled to the first level shift circuit 131 and the first inverter circuit. The second reset circuit 142 may be coupled to the second level shift circuit 132 and the second inverter circuit. When the latch clock signal is at a low level, the reset unit may be adapted to reset a voltage of a node where the level shift unit, the first inverter circuit and the second inverter circuit are coupled, to ensure that there is no residue of the last comparison signal in the latch 12.

Gates of main working transistors, PMOS and NMOS, in an existing comparator are coupled to each other, thus one of the working transistors, PMOS and NMOS, is in a subthreshold region during operation. In other words, at most one transistor is turned on at one time to conduct the amplification and comparison of the to-be-compared signal. Therefore, the existing comparator has the issues of low-speed and low-gain.

In the disclosed embodiments, the comparator may include the pre-operational amplifier, the latch, the level shift unit, and the reset unit. The pre-operational amplifier may be adapted to receive a differential signal inputted to the comparator, and output the first-stage amplification signal according to the differential signal and the latch clock signal.

The latch may include the first inverter circuit and the second inverter circuit that are symmetrical in structure and capable of comparing and amplifying the first-stage amplification signal. The latch may be adapted to receive the first-stage amplification signal, and output the comparison result signal. Because the reset unit resets the voltage of the node where the level shift unit, the first inverter circuit and the second inverter circuit are coupled, to avoid the remaining of the last comparison result in the comparator, thus ensuring the normal operation of the comparator. The level shift unit may generate a potential difference between the MOS transistors in the first inverter circuit and the second inverter circuit, respectively. Therefore, when the comparator jumps from the reset state to the comparison state, both the first inverter circuit and the second inverter circuit may be respectively in a turned-on state in certain low-power-supply-voltage applications. The situation where part of the MOS transistors in the first inverter circuit and the second inverter circuit cannot operate may be avoided, and thus the gain and speed of the comparator may be improved.

In one embodiment, the first level shift circuit 131 may include a third PMOS transistor MP3, and the second level shift circuit 132 may include a fourth PMOS transistor MP4. The third PMOS transistor MP3 may be coupled to the first inverter circuit, and the fourth PMOS transistor MP4 may be coupled to the second inverter circuit. Accordingly, the third PMOS transistor MP3 may generate a certain voltage drop having a value of VDS between the MOS transistors in the first inverter circuit, and the fourth PMOS transistor MP4 may generate a certain voltage drop having a value of VDS between the MOS transistors in the second inverter circuit.

To reduce the structure complexity of the comparator, in one embodiment, the first reset circuit 141 may include a fourth NMOS transistor MN4, and the second reset circuit 142 may include a fifth NMOS transistor MN5. The fourth NMOS transistor MN4 may be coupled to the first inverter circuit, and the fifth NMOS transistor MN5 may be coupled to the second inverter circuit.

In one embodiment, the pre-operational amplifier may include a first NMOS transistor MN1, a second NMOS transistor MN2, a third NMOS transistor MN3, a first PMOS transistor MP1, and a second PMOS transistor MP2. A gate of the first NMOS transistor MN1 may be coupled to the latch clock signal; a source of the first NMOS transistor MN1 may be coupled to the reference ground; and a drain of the first NMOS transistor MN1 may be coupled to a source of the second NMOS transistor MN2 and a source of the third NMOS transistor MN3.

A gate of the second NMOS transistor MN2 may be coupled to a first to-be-compared signal; a source of the second NMOS transistor MN2 may be coupled to the drain of the first NMOS transistor MN1 and the source of the third NMOS transistor MN3, respectively; and a drain of the second NMOS transistor MN2 may be coupled to a drain of the first PMOS transistor MP1. The intersection of the drain of the second NMOS transistor MN2 and the drain of the first PMOS transistor MP1 may serve as a node for outputting the first-stage amplification signal.

A gate of the third NMOS transistor MN3 may be coupled to a second to-be-compared signal; a source of the third NMOS transistor MN3 may be coupled to the drain of the first NMOS transistor MN1 and the source of the second NMOS transistor MN2, respectively; and a drain of the third NMOS transistor MN3 may be coupled to a drain of the second PMOS transistor MP2. The intersection of the drain of the third NMOS transistor MN3 and the drain of the second PMOS transistor MP2 may serve as a node for outputting a second-stage amplification signal.

A gate of the first PMOS transistor MP1 may be coupled to the latch clock signal; a source of the first PMOS transistor MP1 may be coupled to a reference power supply; and the drain of the first PMOS transistor MP1 may be coupled to the drain of the second NMOS transistor MN2. A gate of the second PMOS transistor MP2 may be coupled to the latch clock signal; a source of the second PMOS transistor MP2 may be coupled to the reference power supply; and the drain of the second PMOS transistor MP2 may be coupled to the drain of the third NMOS transistor MN3.

In one embodiment, the first inverter circuit may include a sixth NMOS transistor MN6, an eighth NMOS transistor MN8, a third PMOS transistor MP3, a fifth PMOS transistor MP5, and a seventh PMOS transistor MP7.

A gate of the sixth NMOS transistor MN6 may be coupled to the node for outputting the first-stage amplification signal; a source of the sixth NMOS transistor MN6 may be coupled to the reference ground; and a drain of the sixth NMOS transistor MN6 may be coupled to a drain of the third PMOS transistor MP3 and a drain of the eighth NMOS transistor MN8, respectively.

A gate of the eighth NMOS transistor MN8 may be coupled to a drain of the fifth NMOS transistor MN5; a source of the eighth NMOS transistor MN8 may be coupled to the reference ground; and a drain of the eighth NMOS transistor MN8 may be coupled to the drain of the sixth NMOS transistor MN6 and the drain of the third PMOS transistor MP3, respectively. An intersection where the drain of the eighth NMOS transistor MN8, the drain of the sixth NMOS transistor MN6 and the drain of the third PMOS transistor MP3 are coupled may serve as a node for outputting a first comparison result signal.

A gate of the third PMOS transistor MP3 may be coupled to the reference ground; a source of the third PMOS transistor MP3 may be coupled to a drain of the fourth NMOS transistor MN4 and a drain of the fifth PMOS transistor MP5; and the drain of the third PMOS transistor MP3 may be coupled to the drain of the sixth NMOS transistor MN6 and the drain of the eighth NMOS transistor MN8, respectively.

A gate of the fifth PMOS transistor MP5 may be coupled to the gate of the fourth NMOS transistor MN4 and the gate of the sixth NMOS transistor MN6, respectively; a source of the fifth PMOS transistor MP5 may be coupled to a drain of the seventh PMOS transistor MP7; and a drain of the fifth PMOS transistor MP5 may be coupled to the drain of the fourth NMOS transistor MN4 and the source of the third PMOS transistor MP3, respectively.

A gate of the seventh PMOS transistor MP7 may be coupled to a drain of the fourth PMOS transistor MP4; a source of the seventh PMOS transistor MP7 may be coupled to the reference power supply; and the drain of the seventh PMOS transistor MP7 may be coupled to the source of the fifth PMOS transistor MP5.

In one embodiment, the second inverter circuit may include a seventh NMOS transistor MN7, a ninth NMOS transistor MN9, a fourth PMOS transistor MP4, a sixth PMOS transistor MP6, and an eighth PMOS transistor MP8.

A gate of the seventh NMOS transistor MN7 may be coupled to a gate of the fifth NMOS transistor MN5 and a gate of the sixth PMOS transistor MP6, respectively; a source of the seventh NMOS transistor MN7 may be coupled to the reference ground; and a drain of the seventh NMOS transistor MN7 may be coupled to the drain of the fourth PMOS transistor MP4 and a drain of the ninth NMOS transistor MN9, respectively.

A gate of the ninth NMOS transistor MN9 may be coupled to the source of the third PMOS transistor MP3 and the drain of the fifth PMOS transistor MP5, respectively; a source of the ninth NMOS transistor MN9 may be coupled to the reference ground; and the drain of the ninth NMOS transistor MN9 may be coupled to the drain of the fourth PMOS transistor MP4, the gate of the seventh PMOS transistor MP7 and the drain of the seventh NMOS transistor MN7, respectively. An intersection where the drain of the ninth NMOS transistor MN9, the drain of the fourth PMOS transistor MP4, the gate of the seventh PMOS transistor MP7 and the drain of the seventh NMOS transistor MN7 are coupled may serve as a node for outputting a second comparison result signal.

A gate of the fourth PMOS transistor MP4 may be coupled to the reference ground; a source of the fourth PMOS transistor MP4 may be coupled to a drain of the sixth PMOS transistor MP6, the drain of the fifth NMOS transistor MN5 and the gate of the eighth NMOS transistor MN8, respectively; and a drain of the fourth PMOS transistor MP4 may be coupled to the node for outputting the second comparison result signal.

A gate of the sixth PMOS transistor MP6 may be coupled to the gate of the seventh NMOS transistor MN7 and the gate of the fifth NMOS transistor MN5, respectively; a source of the sixth PMOS transistor MP6 may be coupled to a drain of the eighth PMOS transistor MP8; and the drain of the sixth PMOS transistor MP6 may be coupled to the source of the fourth PMOS transistor MP4 and the gate of the eighth NMOS transistor MN8, respectively.

A gate of the eighth PMOS transistor MP8 may be coupled to the node for outputting the first comparison result signal; a source of the eighth PMOS transistor MP8 may be coupled to the reference power supply; and a drain of the eighth PMOS transistor MP8 may be coupled to the source of the sixth PMOS transistor MP6.

Referring to FIG. 3, working principles of the comparator in the disclosed embodiments will be described in detail as follows.

When the latch clock signal 'latch' is at a low level, the comparator may be in the reset state. The first PMOS transistor MP1 and the second PMOS transistor MP2 may be turned on, the first NMOS transistor MN1 may be turned off, and voltages on a node X1N and a node X1P may be reset to the reference power supply voltage 'VDD'. And then the fourth NMOS transistor MN4, the fifth NMOS transistor MN5, the sixth NMOS transistor MN6 and the seventh NMOS transistor MN7 may be turned on, and voltages on a node X2P and a node OUTP may be pulled down to the reference ground voltage. At the same time, the seventh PMOS transistor MP7 and the eighth PMOS transistor MP8 may be turned on to reset voltages on the source of the fifth PMOS transistor MP5 and the source of the sixth PMOS transistor MP6 to the reference power supply voltage 'VDD'. Thus, the fifth PMOS transistor MP5 and the sixth PMOS transistor MP6 may be turned off, to ensure that the entire comparator has no quiescent current when the comparator is in the reset state.

When the latch clock signal 'latch' is at a high level, the comparator may enter the comparison state. The first NMOS transistor MN1, the second NMOS transistor MN2 and the third NMOS transistor MN3 may be turned on. Therefore, the inputted to-be-compared signals VIP and VIN may be amplified by the second NMOS transistor MN2 and the third NMOS transistor MN3, respectively. The amplified signals may be outputted to the node X1N and the node X1P, respectively. When the comparator is in the reset state, the voltages on the node X1N and the node X1P may be reset to the reference power supply voltage 'VDD'. Therefore, when receiving the signals amplified by the second NMOS transistor MN2 and the third NMOS transistor MN3, the voltages on the node X1N and the node X1P may continue to drop until the voltages on the node X1N and the node X1P drops to (VDD−VTHP). Accordingly, the fifth PMOS transistor MP5 and the sixth PMOS transistor MP6 may be turned on, and an output portion of the comparator may begin to flow into the current. The voltages on the node X2P, the node X2N, the node OUTP and the node OUTN may rise, and the main working transistors of the first inverter circuit in the latch 12, the seventh PMOS transistor MP7 and the eighth NMOS transistor MN8, may start working.

Similarly, the main working transistors of the second inverter circuit in the latch 12, the eighth PMOS transistor MP8 and the ninth NMOS transistor MN9, may start working. The latch 12 may amplify and compare the to-be-compared signals XIP and XIN, and output a high or low level at the node OUTP and the node OUTN according to the polarities of the inputted to-be-compared signals XIP and XIN, accordingly.

In an existing comparator, when the power supply voltage is at a low level, a situation where VDD<VTHP+VTHN occurs under a certain process, resulting in no current or a small current for a long time in the latch 12. Then, one of the transistors in any one inverter circuit operates in a sub-threshold region, such that the comparator has a very long comparison time, and even doesn't work properly.

In the disclosed embodiments, symmetrically configured level shift transistors, the third PMOS transistor MP3 and the fourth PMOS transistor MP4, may be introduced to resolve the issues of low-speed and low-gain. When the latch 12 starts working, a current may flow through the third PMOS transistor MP3 and the fourth PMOS transistor MP4. Therefore, a certain voltage drop having a value of VDS may be generated between the gate of the seventh PMOS transistor MP7 and the gate of the eighth NMOS transistor MN8. Symmetrically, a certain voltage drop having a value of VDS may also be generated between the gate of the eighth PMOS transistor MP8 and the gate of the ninth NMOS transistor MN9.

Accordingly, when the latch 12 starts working, the working transistors, the seventh PMOS transistor MP7 and the eighth NMOS transistor MN8, may be kept turned on at the same time at a low voltage. Correspondingly, the working transistors, the eighth PMOS transistor MP8 and the ninth NMOS transistor MN9, may be kept turned on at the same time at a low voltage. Therefore, the speed of the comparator may be greatly improved. After the comparator identifies the polarity of the inputted signals, the comparator may output one high level and one low level, and then the node OUTP and the node OUTN of the comparator may be turned off. Therefore, the static power consumption of the comparator may be reduced.

In one embodiment, the size of the third PMOS transistor MP3 and the fourth PMOS transistor MP4 may be properly adjusted and configured, and a reasonably sized VDS may be introduced as long as VDD>VTHP+VTHN−VDS is satisfied. VTHP may be the respective threshold voltages of the entire PMOS transistors in the disclosed embodiments, and VTHN may be the respective threshold voltages of the entire NMOS transistors in the disclosed embodiments.

In the disclosed embodiments, the power supply voltage input terminal may be adapted to provide the power supply voltage 'VDD'. The clock signal input terminal may be adapted to provide the latch clock signal 'latch'. The to-be-compared signal input terminal may be adapted to provide the to-be-compared signal VIP and the to-be-compared signal VIN.

To clarify the technical effects of the comparator in the disclosed embodiments, the operation speed of a comparator in the prior art is compared with the operation speed of the comparator in the present disclosure. The specific comparison process and comparison results are described in detail as follows.

Figure 4:
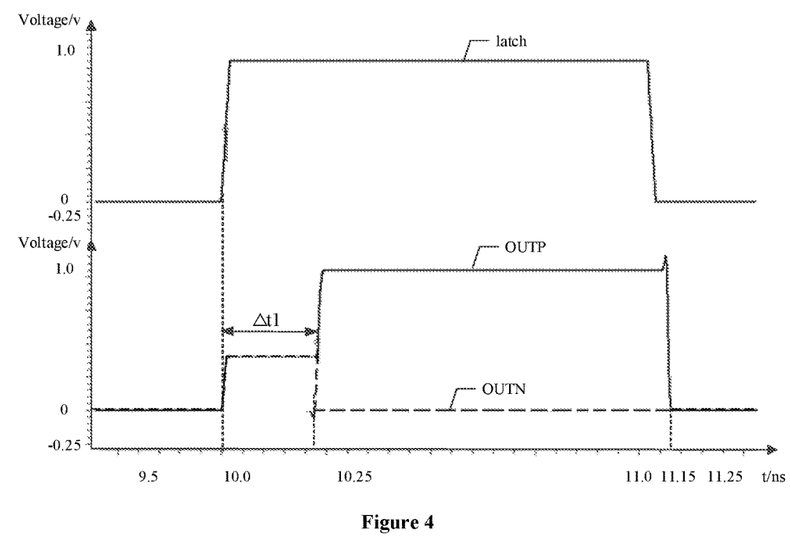
FIG. 4 illustrates an input and output timing sequence diagram of the comparator illustrated in FIG. 2 at a power supply voltage of 1.05 V.
Figure 5:
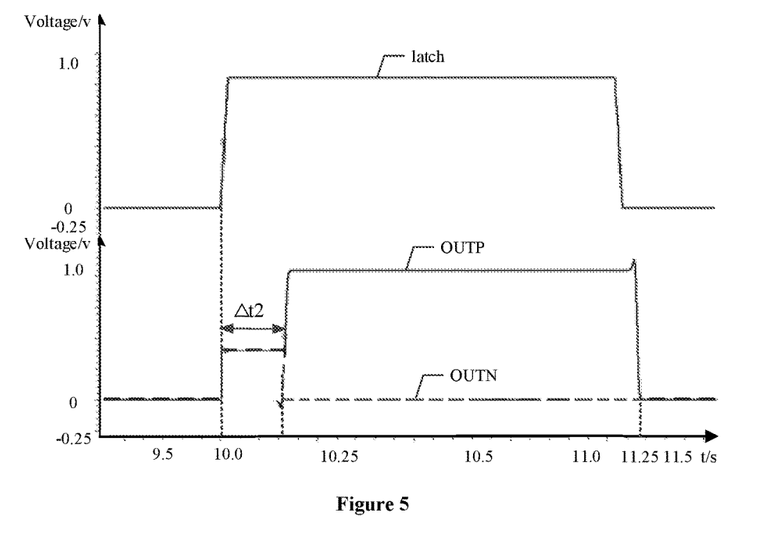
FIG. 5 illustrates an input and output timing sequence diagram of the comparator illustrated in FIG. 3 at a power supply voltage of 1.05 V.

The input signal is a differential signal having a value of 0.4 mV and the power supply voltage 'VDD' is equal to 1.05 V as an example. When the latch clock signal 'latch' is at a high level (i.e., greater than or equal to 0.5 V), FIG. 4 illustrates an input and output timing sequence diagram of a comparator illustrated in FIG. 2 at a power supply voltage of 1.05 V, and FIG. 5 illustrates an input and output timing sequence diagram of a comparator illustrated in FIG. 3 at a power supply voltage of 1.05 V. In other words, the output delay of comparison results of the comparator in the prior art may be referred to FIG. 4, and the output delay of comparison results of the comparator in the present disclosure may be referred to FIG. 5. In FIG. 4 and FIG. 5, the horizontal axis represents time (t), and the unit is second (s); and the vertical axis represents voltage (U), and the unit is volt (V). The horizontal axis is shared by the vertical axes in the upper and lower panels. The dotted line in the lower vertical axis may indicate the variation curve of OUTN, and the solid line in the lower vertical axis may indicate the variation curve of OUTP. Referring to FIG. 4, the variation curves of OUTP and OUTN may substantially coincide during the periods from 0 ns to 10.22 ns and after 11.15 ns. Referring to FIG. 5, the variation curves of OUTP and OUTN may substantially coincident during the periods from 0 ns to 10.156 ns and after 11.15 ns. The variation curves of OUTP and OUTN illustrated in FIG. 4 and FIG. 5 may be related to the magnitude relationship between the inputted to-be-compared signals. When the inputted to-be-compared signals are exchanged with each other, the variation curves of OUTP and OUTN may be exchanged with each other accordingly.

Referring to FIG. 4, when the latch clock signal 'latch' is at a high level, the output delay time of the comparison result of the comparator in the prior art may be Δt1≈220 ps. Referring to FIG. 5, when the latch clock signal 'latch' is at a high level, the output delay time of the comparison result of the comparator in the present disclosure may be ΔT2≈156 ps. Compared with the comparator in the prior art, when the power supply voltage 'VDD' is equal to 1.05V, the computing speed of the comparator in the present disclosure may be greatly improved.

Figure 6:
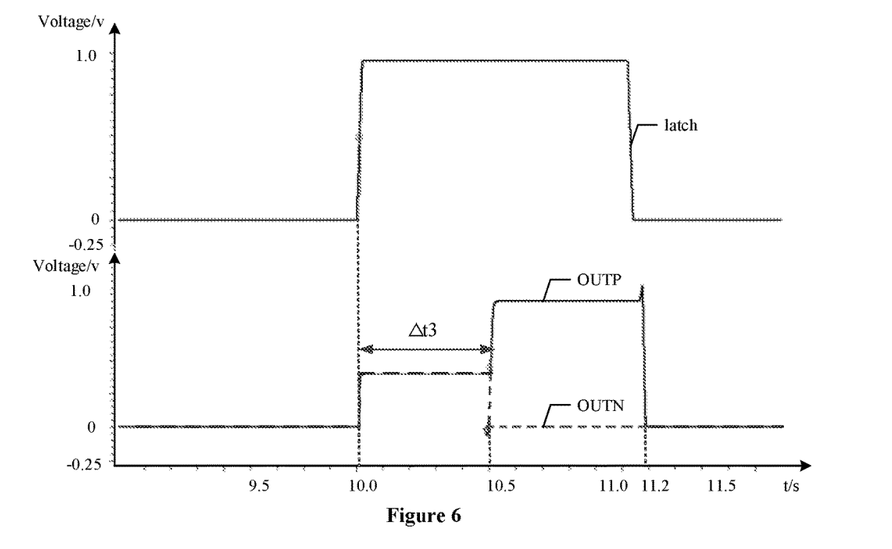
FIG. 6 illustrates an input and output timing sequence diagram of the comparator illustrated in FIG. 2 at a power supply voltage of 0.95 V.
Figure 7:
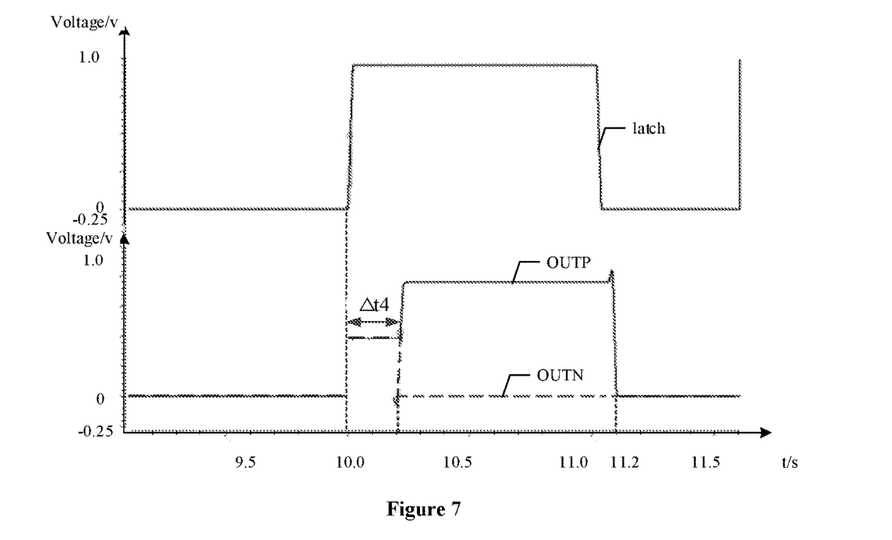
FIG. 7 illustrates an input and output timing sequence diagram of the comparator illustrated in FIG. 3 at a power supply voltage of 0.95 V.

The power supply voltage 'VDD' is equal to 0.95 V and the latch clock signal 'latch' is at a high level (i.e., greater than or equal to 0.5 V) as an example. FIG. 6 illustrates an input and output timing sequence diagram of a comparator illustrated in FIG. 2 at a power supply voltage of 0.95 V, and FIG. 7 illustrates an input and output timing sequence diagram of a comparator illustrated in FIG. 3 at a power supply voltage of 0.95 V. In other words, the output delay of comparison result of the comparator in the prior art may be referred to FIG. 6, and the output delay of comparison result of the comparator in the present disclosure may be referred to FIG. 7. In FIG. 6 and FIG. 7, the horizontal axis represents time (t), and the unit is second (s); and the vertical axis represents voltage (U), and the unit is volt (V). The horizontal axis is shared by the vertical axes in the upper and lower panels. The dotted line in the lower vertical axis may indicate the variation curve of OUTN, and the solid line in the lower vertical axis may indicate the variation curve of OUTP. Referring to FIG. 6, the variation curves of OUTP and OUTN may substantially coincide during the periods from 0 ns to 10.495 ns and after 11.5 ns. Referring to FIG. 7, the variation curves of OUTP and OUTN may substantially coincident during the periods from 0 ns to 10.207 ns and after 11.2 ns. The variation curves of OUTP and OUTN illustrated in FIG. 6 and FIG. 7 may be related to the magnitude relationship between the inputted to-be-compared signals. When the inputted to-be-compared signals are exchanged with each other, the variation curves of OUTP and OUTN may be exchanged with each other accordingly.

Referring to FIG. 6, when the latch clock signal 'latch' is at a high level, the output delay time of the comparison result of the comparator in the prior art may be $\Delta t1 \approx 495$ ps. Referring to FIG. 7, when the latch clock signal 'latch' is at a high level, the output delay time of the comparison result of the comparator in the present disclosure may be $\Delta T2 \approx 207$ ps.

Comparing FIG. 6 with FIG. 7, when the power supply voltage 'VDD' is equal to 0.95V, the output delay time of the comparison result of the comparator in the prior art may be long. In other words, the operating speed of the comparator in the prior art may be slow, and the comparator may not be suitable for high-speed applications. In contrast, the operating speed of the comparator in the present disclosure may increase by 1.39 times. Therefore, the gain and speed of the comparator in the present disclosure may be improved. Comparing FIG. 4 with FIG. 6, as the power supply voltage 'VDD' decreases, the output delay time of comparison result of the comparator in the prior art becomes longer and longer. In other words, the operating speed of the comparator in the prior art is greatly impacted by the power supply voltage.

Comparing FIG. 5 with FIG. 7, as the power supply voltage 'VDD' decreases, the output delay time of comparison result of the comparator in the present disclosure may be much smaller than the output delay time of comparison result of the comparator in the prior art. In other words, with respect to the operating speed of the comparator in the prior art, the operating speed of the comparator in the present disclosure may be less affected by the power supply voltage, and the disclosed comparator may be more suitable for high-speed applications.

The present disclosure also provides a successive approximation analog-to-digital converter. The successive approximation analog-to-digital converter may include the comparator in the disclosed embodiments and a digital/analog conversion circuit (DAC) connected to the input terminal of the comparator.

In one embodiment, in addition to the comparator, the successive approximation analog-to-digital converter may also include a controller (SAR Logic) connected to the output terminal OUTP and the output terminal OUTN of the comparator. The input terminal of the controller may be coupled to the output terminals of the comparator, and the output terminal of the controller may be coupled to the digital/analog conversion circuit.

In one embodiment, in addition, the successive approximation analog-to-digital converter may include a reference circuit (S/H) for providing a reference signal to the digital/analog conversion circuit. The reference circuit may be coupled to the digital/analog conversion circuit.

In one embodiment, moreover, the successive approximation analog-to-digital converter may include a detection logic unit. The detection logic unit may be adapted to generate an asynchronous clock signal to control the operating state of the comparator until the comparator completes a preset number of times of comparison.

Working principles of the successive approximation analog-digital converter may include the following. A comparison result of the comparator may be inputted to the SAR Logic, and a corresponding digital signal may be generated by the SAR Logic according to the comparison result and inputted to the DAC. Then, the DAC may perform a digital-to-analog conversion on the signal outputted from the SAR Logic based on the reference signal outputted from the reference circuit, and may input a conversion result to the input terminal of the comparator. In addition to generating the control signal of the DAC, the detection logic unit may automatically detect the output state of the comparator and adaptively generate an internal high-speed asynchronous clock signal 'clk' for controlling the operating state of the comparator until the comparator completes the corresponding number of times of comparison. The operating state may include two states: a reset state and a comparison state. After the ADC has completed entire conversion and comparison, the conversion result of the DAC, that is the input voltage of the comparator, may approach zero.

In the disclosed embodiments, the comparator may include the pre-operational amplifier, the latch, the level shift unit, and the reset unit. The reset unit may reset the voltage of the node where the level shift unit, the first inverter circuit and the second inverter circuit are coupled, to avoid the remaining of the last comparison result in the comparator, thus ensuring the normal operation of the comparator.

The level shift unit may generate a potential difference between the MOS transistors in the first inverter circuit and the second inverter circuit, respectively. Therefore, when the comparator jumps from the reset state to the comparison state, both the first inverter circuit and the second inverter circuit may be respectively in a turned-on state in certain low-power-supply-voltage applications. The situation where part of the MOS transistors in the first inverter circuit and the second inverter circuit cannot operate may be avoided, and thus the gain and speed of the comparator may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A comparator, comprising:
   a pre-operational amplifier, for receiving a to-be-compared signal inputted to the comparator, and outputting a first-stage amplification signal according to the to-be-compared signal and a latch clock signal;
   a latch, including a first inverter circuit and a second inverter circuit that have a same structure and are symmetrically configured, and for receiving and comparing the first-stage amplification signal, and outputting a corresponding comparison result signal according to a comparison result;

a level shift unit, including a first level shift circuit and a second level shift circuit that are symmetrically configured, and for generating a potential difference between working transistors in the first inverter circuit and the second inverter circuit, respectively; and a reset unit, including a first reset circuit and a second reset circuit that are symmetrically configured, and for resetting a voltage of a node where the level shift unit, the first inverter circuit and the second inverter circuit are coupled when the latch clock signal is at a low level.

2. The comparator according to claim 1, wherein:
the first inverter circuit and the second inverter circuit are connected in parallel between a reference power supply and a reference ground;
a signal input terminal of the first inverter circuit is connected to a signal output terminal of the second inverter circuit, and a signal output terminal of the first inverter circuit is connected to a signal input terminal of the second inverter circuit;
the first level shift circuit is coupled to the reset unit and the first inverter circuit, and is adapted to turn on the first inverter circuit when the comparator jumps from a reset state to a comparison state;
the second level shift circuit is coupled to the reset unit and the second inverter circuit, and is adapted to turn on the second inverter circuit when the comparator jumps from the reset state to the comparison state;
the first reset circuit is coupled to the first level shift circuit and the first inverter circuit; and
the second reset circuit is coupled to the second level shift circuit and the second inverter circuit.

3. The comparator according to claim 2, wherein:
the first level shift circuit includes a third PMOS transistor coupled to the first inverter circuit; and
the second level shift circuit includes a fourth PMOS transistor coupled to the second inverter circuit.

4. The comparator according to claim 2, wherein:
the first reset circuit includes a fourth NMOS transistor coupled to the first inverter circuit; and
the second reset circuit includes a fifth NMOS transistor coupled to the second inverter circuit.

5. The comparator according to claim 2, wherein:
the pre-operational amplifier includes a first NMOS transistor, a second NMOS transistor, a third NMOS transistor, a first PMOS transistor, and a second PMOS transistor.

6. The comparator according to claim 5, wherein:
a gate of the first NMOS transistor is coupled to the latch clock signal, a source of the first NMOS transistor is coupled to the reference ground, and a drain of the first NMOS transistor is coupled to a source of the second NMOS transistor and a source of the third NMOS transistor;
a gate of the second NMOS transistor is coupled to a first to-be-compared signal, the source of the second NMOS transistor is coupled to the drain of the first NMOS transistor and the source of the third NMOS transistor, and a drain of the second NMOS transistor is coupled to a drain of the first PMOS transistor;
a gate of the third NMOS transistor is coupled to a second to-be-compared signal, the source of the third NMOS transistor is coupled to the drain of the first NMOS transistor and the source of the second NMOS transistor, and a drain of the third NMOS transistor is coupled to a drain of the second PMOS transistor;

a gate of the first PMOS transistor is coupled to the latch clock signal, a source of the first PMOS transistor is coupled to a reference power supply, and the drain of the first PMOS transistor is coupled to the drain of the second NMOS transistor; and
a gate of the second PMOS transistor is coupled to the latch clock signal, a source of the second PMOS transistor is coupled to the reference power supply, and the drain of the second PMOS transistor is coupled to the drain of the third NMOS transistor.

7. The comparator according to claim 6, wherein:
an intersection where the drain of the second NMOS transistor and the drain of the first PMOS transistor are coupled serves as a node for outputting a first-stage amplification signal; and
an intersection where the drain of the third NMOS transistor and the drain of the second PMOS transistor are coupled serves as a node for outputting a second-stage amplification signal.

8. The comparator according to claim 7, wherein:
the first inverter circuit includes a sixth NMOS transistor, an eighth NMOS transistor, a third PMOS transistor, a fifth PMOS transistor, and a seventh PMOS transistor.

9. The comparator according to claim 8, wherein:
a gate of the sixth NMOS transistor is coupled to the node for outputting the first-stage amplification signal, a source of the sixth NMOS transistor is coupled to the reference ground, and a drain of the sixth NMOS transistor is coupled to a drain of the third PMOS transistor and a drain of the eighth NMOS transistor;
a gate of the eighth NMOS transistor is coupled to a drain of the fifth NMOS transistor, a source of the eighth NMOS transistor is coupled to the reference ground, and a drain of the eighth NMOS transistor is coupled to the drain of the sixth NMOS transistor and the drain of the third PMOS transistor;
a gate of the third PMOS transistor is coupled to the reference ground, a source of the third PMOS transistor is coupled to a drain of the fourth NMOS transistor and a drain of the fifth PMOS transistor, and the drain of the third PMOS transistor is coupled to the drain of the sixth NMOS transistor and the drain of the eighth NMOS transistor;
a gate of the fifth PMOS transistor is coupled to a gate of the fourth NMOS transistor and the gate of the sixth NMOS transistor, a source of the fifth PMOS transistor is coupled to a drain of the seventh PMOS transistor, and the drain of the fifth PMOS transistor is coupled to the drain of the fourth NMOS transistor and the source of the third PMOS transistor; and
a gate of the seventh PMOS transistor is coupled to a drain of the fourth PMOS transistor, a source of the seventh PMOS transistor is coupled to the reference power supply, and the drain of the seventh PMOS transistor is coupled to the source of the fifth PMOS transistor.

10. The comparator according to claim 9, wherein:
an intersection where the drain of the eighth NMOS transistor, the drain of the sixth NMOS transistor and the drain of the third PMOS transistor are coupled serves as a node for outputting a first comparison result signal.

11. The comparator according to claim 10, wherein:
the second inverter circuit includes a seventh NMOS transistor, a ninth NMOS transistor, a fourth PMOS transistor, a sixth PMOS transistor, and an eighth PMOS transistor.

12. The comparator according to claim 11, wherein:
a gate of the seventh NMOS transistor is coupled to a gate of the fifth NMOS transistor and a gate of the sixth PMOS transistor, a source of the seventh NMOS transistor is coupled to the reference ground, and a drain of the seventh NMOS transistor is coupled to the drain of the fourth PMOS transistor and a drain of the ninth NMOS transistor;
a gate of the ninth NMOS transistor is coupled to the source of the third PMOS transistor and the drain of the fifth PMOS transistor, a source of the ninth NMOS transistor is coupled to the reference ground, and the drain of the ninth NMOS transistor is coupled to the drain of the fourth PMOS transistor, the gate of the seventh PMOS transistor and the drain of the seventh NMOS transistor;
a gate of the fourth PMOS transistor is coupled to the reference ground, a source of the fourth PMOS transistor is coupled to a drain of the sixth PMOS transistor, the drain of the fifth NMOS transistor and the gate of the eighth NMOS transistor, and the drain of the fourth PMOS transistor is coupled to the drain of the ninth NMOS transistor, the gate of the seventh PMOS transistor and the drain of the seventh NMOS transistor;
the gate of the sixth PMOS transistor is coupled to the gate of the seventh NMOS transistor and the gate of the fifth NMOS transistor, a source of the sixth PMOS transistor is coupled to a drain of the eighth PMOS transistor, and the drain of the sixth PMOS transistor is coupled to the source of the fourth PMOS transistor and the gate of the eighth NMOS transistor; and
a gate of the eighth PMOS transistor is coupled to the node for outputting the first comparison result signal, a source of the eighth PMOS transistor is coupled to the reference power supply, and the drain of the eighth PMOS transistor is coupled to the source of the sixth PMOS transistor.

13. The comparator according to claim 12, wherein:
an intersection where the drain of the ninth NMOS transistor, the drain of the fourth PMOS transistor, the gate of the seventh PMOS transistor and the drain of the seventh NMOS transistor are coupled serves as a node for outputting a second comparison result signal.

14. A successive approximation analog-to-digital converter, comprising:
a comparator and a digital/analog conversion circuit coupled to an input terminal of the comparator, wherein the comparator includes:
a pre-operational amplifier, for receiving a to-be-compared signal inputted to the comparator, and outputting a first-stage amplification signal according to the to-be-compared signal and a latch clock signal,
a latch, including a first inverter circuit and a second inverter circuit that have a same structure and are symmetrically configured, and for receiving and comparing the first-stage amplification signal, and outputting a corresponding comparison result signal according to a comparison result,
a level shift unit, including a first level shift circuit and a second level shift circuit that are symmetrically configured, and for generating a potential difference between working transistors in the first inverter circuit and the second inverter circuit, respectively, and
a reset unit, including a first reset circuit and a second reset circuit that are symmetrically configured, and for resetting a voltage of a node where the level shift unit, the first inverter circuit and the second inverter circuit are coupled when the latch clock signal is at a low level.

15. The successive approximation analog-to-digital converter according to claim 14, wherein:
the first inverter circuit and the second inverter circuit are connected in parallel between a reference power supply and a reference ground;
a signal input terminal of the first inverter circuit is connected to a signal output terminal of the second inverter circuit, and a signal output terminal of the first inverter circuit is connected to a signal input terminal of the second inverter circuit;
the first level shift circuit is coupled to the reset unit and the first inverter circuit, and is adapted to turn on the first inverter circuit when the comparator jumps from a reset state to a comparison state;
the second level shift circuit is coupled to the reset unit and the second inverter circuit, and is adapted to turn on the second inverter circuit when the comparator jumps from the reset state to the comparison state;
the first reset circuit is coupled to the first level shift circuit and the first inverter circuit; and
the second reset circuit is coupled to the second level shift circuit and the second inverter circuit.

16. The successive approximation analog-to-digital converter according to claim 15, wherein:
the first level shift circuit includes a third PMOS transistor coupled to the first inverter circuit;
the second level shift circuit includes a fourth PMOS transistor coupled to the second inverter circuit;
the first reset circuit includes a fourth NMOS transistor coupled to the first inverter circuit; and
the second reset circuit includes a fifth NMOS transistor coupled to the second inverter circuit.

17. The successive approximation analog-to-digital converter according to claim 15, wherein:
the pre-operational amplifier includes a first NMOS transistor, a second NMOS transistor, a third NMOS transistor, a first PMOS transistor, and a second PMOS transistor;
the first inverter circuit includes a sixth NMOS transistor, an eighth NMOS transistor, a third PMOS transistor, a fifth PMOS transistor, and a seventh PMOS transistor; and
the second inverter circuit includes a seventh NMOS transistor, a ninth NMOS transistor, a fourth PMOS transistor, a sixth PMOS transistor, and an eighth PMOS transistor.

18. The successive approximation analog-to-digital converter according to claim 15, further including:
a controller, including an input terminal coupled to an output terminal of the comparator, and an output terminal coupled to the digital/analog conversion circuit.

19. The successive approximation analog-to-digital converter according to claim 15, further including:
a reference circuit, coupled to the digital/analog conversion circuit, and for providing a reference signal to the digital/analog conversion circuit.

20. The successive approximation analog-to-digital converter according to claim 15, further including:
a detection logic unit, for generating an asynchronous clock signal to control an operating state of the comparator until the comparator completes a preset number of times of comparison.

* * * * *